(12) United States Patent
Greenfield et al.

(10) Patent No.: US 9,847,791 B2
(45) Date of Patent: Dec. 19, 2017

(54) SYSTEM AND METHOD FOR COMPRESSING DATA USING ASYMMETRIC NUMERAL SYSTEMS WITH PROBABILITY DISTRIBUTIONS

(71) Applicants: Daniel Greenfield, Cambridge (GB); Alban Rrustemi, Cambridge (GB)

(72) Inventors: Daniel Greenfield, Cambridge (GB); Alban Rrustemi, Cambridge (GB)

(*) Notice: Subject to any disclaimer, the term of this patent is extended or adjusted under 35 U.S.C. 154(b) by 0 days.

(21) Appl. No.: 15/041,228

(22) Filed: Feb. 11, 2016

(65) Prior Publication Data
US 2016/0248440 A1 Aug. 25, 2016

(30) Foreign Application Priority Data
Feb. 11, 2015 (GB) .................... 1502286.6

(51) Int. Cl.
*H03M 7/34* (2006.01)
*H03M 7/30* (2006.01)

(52) U.S. Cl.
CPC .................... *H03M 7/30* (2013.01)

(58) Field of Classification Search
CPC .................... H03M 7/30
USPC .................... 341/51, 65, 67, 107
See application file for complete search history.

(56) References Cited

U.S. PATENT DOCUMENTS

| | | | | |
|---|---|---|---|---|
| 5,710,562 | A * | 1/1998 | Gormish | G06T 9/005 341/106 |
| 6,606,037 | B2 * | 8/2003 | Ekstrand | G06T 9/005 341/50 |
| 7,095,343 | B2 * | 8/2006 | Xie | H03M 7/4006 341/106 |
| 7,840,403 | B2 | 11/2010 | Mehrotra et al. | |
| 2016/0248440 | A1 | 8/2016 | Greenfield et al. | |

OTHER PUBLICATIONS

"Intel SSE4.1 Programming Reference", Intel Corporation, D91561-001, Apr. 2007, 196 pages. (NPL #4 cited, but not provided by the applicant).*

"Reducing Whole-Genome Data Storage Footprint", White Paper: Informatics, Illumina, Apr. 17, 2014. Available at: http://www.illumina.com/documents/products/whitepapers/whitepaper_datacompression.pdf (NPL #5 cited, but not provided by the applicant).*

Duda, Jarek, "Asymmetric numeral systems: entropy coding combining speed of Huffman coding with compression rate of arithmetic coding", arXiv:11311.2540 [cs.IT], Nov. 11, 2013 (Submitted) and Jan. 6, 2014 (Last revised), pp. 1-24.

Giesen, Fabian, "Interleaved Entropy Coders", arXiv:1402.3392 [cs.IT], Feb. 14, 2014, pp. 1-16.

Cormack, G. V., et al., "Data Compression Using Dynamic Markov Modelling", The Computer Journal, vol. 30, No. 6, Dec. 1987, pp. 541-550.

(Continued)

*Primary Examiner* — Khai M Nguyen

(57) ABSTRACT

A data compression method using the range variant of asymmetric numeral systems to encode a data stream, where the probability distribution table is constructed using a Markov model. This type of encoding results in output that has higher compression ratios when compared to other compression algorithms and it performs particularly well with information that represents gene sequences or information related to gene sequences.

15 Claims, 2 Drawing Sheets

(56) References Cited

OTHER PUBLICATIONS

Figure 1:
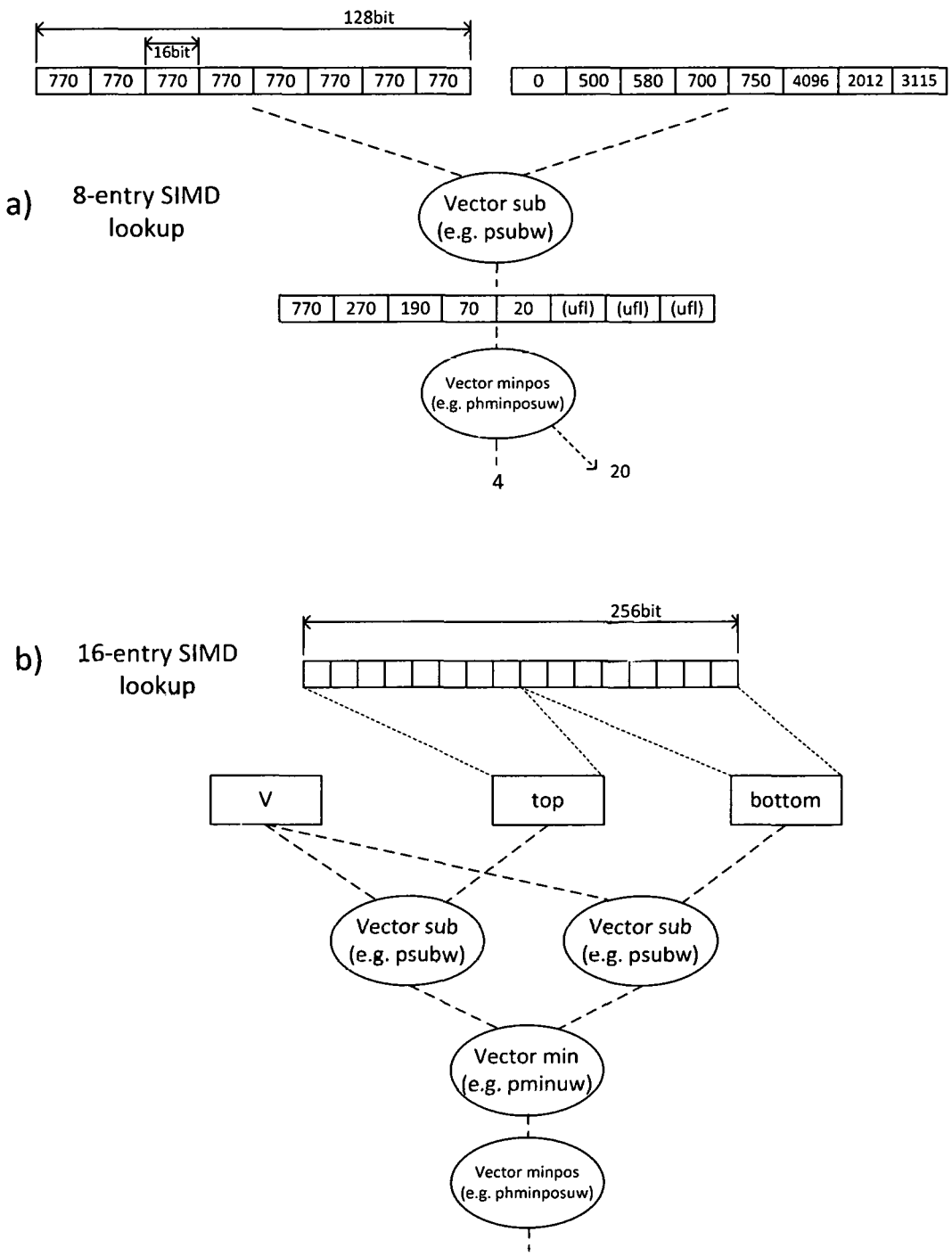

"Intel SSE4.1 Programming Reference", Intel Corporation, D91561-001, Apr. 2007, 196 pages.

"Reducing Whole-Genome Data Storage Footprint", White Paper: Informatics, illumina, Apr. 17, 2014. Available at: http://www.illumina.com/documents/products/whitepapers/whitepaper_datacompression.pdf.

Cánovas, Rodrigo, et al. "Lossy Compression of Quality Scores in Genomic Data", Bioinformatics Advance Access, Sequence Analysis, vol. 30, No. 15, Apr. 10, 2014 (Advance Access publication date), pp. 2130-2136.

Yu, Y. William, et al., "Traversing the k-mer Landscape of NGS Read Datasets for Quality Score Sparsification", Springer, Research in Computational Molecular Biology, Lecture Notes in Computer Science, vol. 8394, Apr. 2014, pp. 385-399.

Ziv, Jacob, et al., "A Universal Algorithm for Sequential Data Compression", IEEE, IEEE Transactions on Information Theory, vol. IT-23, No. 3, May 1977, pp. 337-343.

Search Report Received for United Kingdom Patent Application No. GB1502286.6, dated Sep. 7, 2016, 3 pages.

"First test implementation of the rANS encoder, to replace arithmetic", Retrieved on May 18, 2017, 22 pages. Available at: https://sourceforge.net/p/staden/code/3574/.

"Unrolling arithmetic coding", Retrieved on May 18, 2017, 16 pages. Available at: https://encode.ru/threads/1867-Unrolling-arithmetic-coding?p=36630&viewfull=1#post36630.

"Arithmetic Coding + Statistical Modeling = Data Compression", Retrieved on May 18, 2017, 34 pages. http://marknelson.us/1991/02/01/arithmetic-coding-statistical-modeling-data-compression/.

"Reducing the header—optimal quantization/compression of probability distribution?", Retrieved on May 18, 2017, 24 pages. Available at: https://encod.ru/threads/1883-Reducing-the-header%20-optimal-quantization-compression-of-probability-distribution.

3rd Party Observation Received from James Bonfield for United Kingdom Patent Application No. GB1502286.6, dated Jan. 25, 2017, 2 pages.

* cited by examiner

SYSTEM AND METHOD FOR COMPRESSING DATA USING ASYMMETRIC NUMERAL SYSTEMS WITH PROBABILITY DISTRIBUTIONS

TECHNICAL FIELD

The present disclosure relates to methods of compressing data, in particular to encoding and decoding methods that involve the range variant of asymmetric numeral systems (rANS). More specifically, the present disclosure concerns a method of using probability distribution tables that are constructed using Markov modelling of subsets of data as part of rANS encoding. The present disclosure also concerns the use of this encoding method in compressing data. More specifically, the present disclosure concerns the use of this method in compressing information that contains or is related to gene sequences. Furthermore, the present disclosure relates to software products recorded on machine readable data storage media, wherein the software products are executable on computing hardware for implementing aforesaid methods.

BACKGROUND

The most popular compression algorithms use one of the following two approaches for encoding data, i.e. Huffman encoding and arithmetic/range encoding.

Huffman encoding is much faster but may result in low compression rates. Further, arithmetic encoding, on the other hand, results in higher compression rates at the expense of additional computational cost (i.e. slower) for encoding and decoding. Moreover, Asymmetric Numeral Systems (ANS) represent a relatively new approach to lossless entropy encoding, with the potential to combine the speed of Huffman encoding and compression ratios of arithmetic encoding (Jarek Duda, Asymmetric numeral systems: entropy coding combining speed of Huffman coding with compression rate of arithmetic coding, arXiv:1311.2540 [cs.iT], 2013, F. Giesen, Interleaved entropy coders, arXiv: 1402.3392 [cs.IT], 2014).

Further, ANS has two general drawbacks:
1. it relies on a static probability distribution, and
2. it decodes symbols in the reverse order to encoding (i.e. it is LIFO—Last In First Out), making it unsuitable for very large blocks of data.

There are several implications that result from ANS's reliance on static probability distributions:
1. a static probability distribution either needs to be built on the full dataset, or a subset of it. This needs to be done before compression can proceed.
2. The probability distributions themselves can be resource intensive to store, especially for compressing small blocks of data. For large blocks of data, the probability distribution is expensive to calculate. Since a fixed probability distribution is required before compression can begin, building a distribution table on a large dataset is not a practical option for streaming applications.
3. If a symbol is encountered that has an expected probability of 0 then it will fail encoding and corrupt subsequent data
4. Adjusting the probability of rare symbols to a minimum positive value can greatly affect the compression achieved. For example if only 12 symbols are used for 99.9999% of the data, but there are 256 total symbols supported, then allocating a non-zero probability to the other 244 symbols can result in a considerable reduction of compression efficiency for the 12 main symbols, especially if probability distributions are on an integer scale of 4096.

Also, there is another issue with rANS variant: despite its highly efficient coding scheme, it assumes that each symbol is independent of history (i.e. rANS does not exploit inter-symbol redundancy). This means that, unless carefully managed, rANS by itself can easily perform worse when compared to other approaches such as zlib even though that only uses Huffman compression.

Therefore, there exists a need for an efficient data compression method and a system.

SUMMARY

The present disclosure seeks to provide an improved method of data compression.

The present disclosure also seeks to provide a system configured to efficiently perform the data compression.

According to an aspect of the present disclosure, a method is provided for encoding a data stream using the rANS technique. The rANS utilises a probability distribution table that is constructed using a Markov model.

The method of the present disclosure provides better compression ratios without a significant impact on the speed of compression and decompression.

Optionally, the method may further comprise utilising a plurality of probability distribution tables. Each of the plurality of probability distribution tables is constructed using a Markov model from a subset of the data stream. The additional probability distribution tables better represent the data that is being compressed. The construction of these multiple tables is conducted across stages, in an iterative manner. The initial portion of the data are compressed using a first model. Further, when the compression of this initial portion is conducted, a probability distribution table can be optionally constructed alongside compression. This new table can then be used to compress a subsequent portion of the data.

Optionally, the method presented in this disclosure includes an escape code that is used to extend the probability distribution table in order to handle the process of encoding of symbols or transitions encountered in data that cannot be encoded directly from the information that is present in the probability distribution table. This provides simpler handling of cases where the model does not cover symbols or transitions, making the method simpler, more efficient, and faster.

Optionally, the method presented in this disclosure includes steps to compress and decompress the probability distribution tables. This reduces overheads of storing these tables, alongside encoded/compressed data.

According to another aspect of the present disclosure, a computing device (or a system) executing the above method for encoding the data stream using the rANS technique is provided. Further, the computing device is configured to store data that is encoded using the above method.

DESCRIPTION OF THE DIAGRAMS

Figure 2:
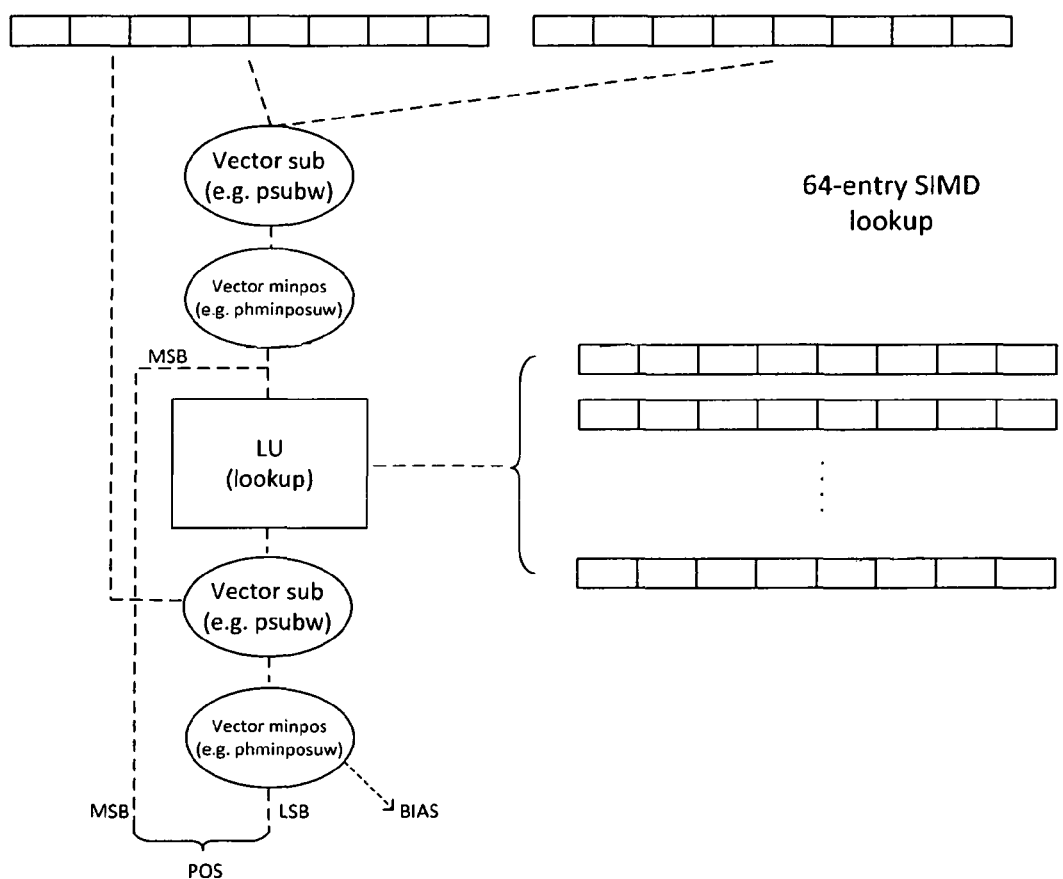

Embodiments of the present disclosure will now be described, by way of example only, with reference to the following diagrams wherein:

FIG. 1 is a schematic illustration of efficient lookups that can be executed using SIMD operations; and FIG. 2 is a schematic illustration of tree-based vector lookups that can be executed using SIMD operations for a full table that is 64 entries in size.

DETAILED DESCRIPTION OF EMBODIMENTS

In an embodiment, rANS can use tables to store the approximate probability distribution of symbols, where typically there are many approximate tables to choose from. It is simpler than conventional arithmetic encoding because it uses a single natural number as the state, instead of using a pair to represent a range. Further, compared to conventional arithmetic encoding, this simplicity also results in significant improvements in encoding/decoding performance. There are different ANS approaches to encoding, with range ANS (rANS) being among the most promising. The rANS approach also allows vectorisable SIMD processing, which enables further performance improvements in modern CPU and GPU architectures. The rANS approach utilises techniques in the alignment and cumulative probability distribution to use simple lookups and bit shifts, with a vectorisable version that fits into 4×32-bit or 8×32-bit SIMD processing pipelines. In particular such a SIMD version will be very efficient when used with a probability distribution table scaled to 4096 integer values.

The behaviour of the probability distribution for ANS encoding can be constructed by using a Markov chain compression model that describes a subset of the data. A Markov modelling technique as described by G. V. Cormack and R. N. S. Horspool, in Data Compression Using Dynamic Markov Modelling, The Computer Journal, V 30, I 6, 1987, P 541-550 can be used to construct n'th order Markov models and the corresponding probability distribution table.

A detailed account of encoding and decoding methods used in the general rANS approach can be found in Duda. The rANS compression can be expressed by function E to encode (compress) and D to decode (decompress) a symbol S while in state X using probability model M. The encoding function can be thought of as moving the ANS encoder from state $X_k$ to state $X_{k+1}$ using model $M_k$ on symbol $S_k$. The decoding function reverses the action of the encoding function, from state $X_{k+1}$ to recover symbol $S_k$ and state $X_k$.

$$X_{k+1} = E(X_k, M_k, S_k)$$

$$(X_k, S_k) = D(X_{k+1}, M_k)$$

This means that decoding operates in the reverse order of encoding like a stack (LIFO).

Further, the present disclosure is associated with following exemplary methods:

A) A Method for Using a Markov Model

For n'th order Markov-chain models with n symbols of context, the following equation can be used:

$$M_k = \begin{cases} Q, & k \leq n \\ M(S_{k-1}, \ldots, S_{k-n}), & k > n \end{cases}$$

where Q is a static probability distribution (uniform or otherwise). The function M selects a probability distribution based on the context of previous symbols. In particular, the model $M(S_{k-1}, \ldots, S_{k-n})$ approximates/matches the symbol distribution:

$$Pr(S_k|M(S_{k-1}, \ldots, S_{k-n})) \approx Pr(S_k|S_{k-1}, S_{k-2}, \ldots, S_{k-n})$$

That is, this approximates an order-n Markov-chain transition probability model.

To decompress in-order, symbols $\{S_1, \ldots, S_N\}$ are compressed in reverse order so that (k increasing from 1 to N):

$$X_{k+1} = E(X_k, M_{N-k+1}, S_{N-k+1})$$

and in decompressing in-order we then have (k increasing from 1 to N):

$$(X_{N-k+1}, S_k) = D(X_{N-k+2}, M_k)$$

B) A Method for Handling Unexpected Transitions/Symbols

In order to handle the special case where $Pr(S_k|M(S_{k-1}, \ldots, S_{k-n}))=0$, the encoder and decoder are replaced with modified versions E' and D' respectively using modified model M' that incorporates an escape code (esc). In particular:

$$E'(X_k, M'_{N-k+1}, S_{N-k+1}) =$$
$$\begin{cases} E(E(X_k, U, S_{N-k+1}), M'_{N-k+1}, \langle esc \rangle) & Pr(S_{N-k+1}|M'_{N-k+1}) = 0 \\ E(X_k, M'_{N-k+1}, S_{N-k+1}) & \text{otherwise} \end{cases}$$

$$M'_k = \begin{cases} Q, & k \leq n \\ M'(S'_{k-1}, \ldots, S'_{k-n}), & k > n \end{cases}$$

$$S'_k = \begin{cases} T & Pr(S_k|M'_k) = 0 \\ S_k & \text{otherwise} \end{cases}$$

where U is a static probability distribution model (uniform or otherwise, that could also be Q) such that $Pr(S_{N-k+1}|U) \neq 0$, and T is a predictable (fixed or otherwise) replacement symbol, preferably such that $P_r(T|M'_{N-k+1}) \neq 0$. Also, the conditional probability test $Pr(S_{N-k+1}|M'_{N-k+1})=0$ can be replaced with a range test instead, whereby it is assumed all symbols outside of an expected range have probability zero, and all within the range have non-zero probability. The Markov model is also modified so that the symbol (esc) is present with non-zero probability at each Markov state. The model uses a filtered symbol history (S' instead of S) whereby escape coded symbols (with probability zero expected occurrence) are replaced with valid symbols of non-zero expected occurrence.

The modified encoder above is in practice accomplished by mapping zero probability transitions in the Markov model directly to the escape code. When such an escape code condition is encountered, prior to encoding the escape code, the real symbol is encoded using the alternative model U.

Similarly, for the reverse transform of decoding:

$$D'(X_{N-k+2}, M'_k) = \begin{cases} D(x, U) & \exists x \, st \, (x, \langle esc \rangle) = D(X_{N-k+2}, M'_k) \\ D(X_{N-k+2}, M'_k) & \text{otherwise} \end{cases}$$

$$M'_k = \begin{cases} Q, & k \leq n \\ M'(S'_{k-1}, \ldots, S'_{k-n}), & k > n \end{cases}$$

$$S'_k = \begin{cases} T & \exists x \, st \, (x, \langle esc \rangle) = D(X_k, M'_k) \\ S_k & \text{otherwise} \end{cases}$$

This decoding is accomplished by having the regular decoder attempt decoding the symbol, and if an escape code symbol is encountered, to decode again using model U to recover the real symbol.

The disclosure is associated with a way of embodying the escape code in practice. The ordinary rANS encoding step can be described as:

$$E(X,M,S)=m\lfloor X/l(M,S) \rfloor + b(M,S) + \mod(X,l(M,S))$$

where m is the base of the ANS system (for example 4096). Here l(M,S) corresponds to the expected occurrence of the symbol S in model M scaled to base m (e.g. expected probability of 0.25 would yield 1024 for base 4096). Here b(M,S) corresponds to the starting position of symbol S in the cycle (see Duda for more details). If an escape code is reserved, in particular, M can be modified to a scale to 4095 instead of 4096, and then set:

$$b(M,\langle esc \rangle)=0$$

$$l(M,\langle esc \rangle)=1$$

which places the escape code at a special position that can help to speed up detection of the escape code during decompression.

The ordinary rANS decoding step (for fixed model M) can be represented as:

$$D(X, M) = (\lfloor X/m \rfloor l(M, S) + g(M, \mod(X, m)), S)$$

where:

$$g(M, y) = y - b(M, s(M, y))$$

$$S = s(M, \mod(X, m))$$

$$s(M, x) = \min\left\{ j : x < \sum_{i=0}^{j} l(M, i) \right\}$$

$$b(M, j) = \sum_{i=0}^{j-1} l(M, i)$$

(see Duda for more details). In practice, lookup tables of size m can be used for both s and g. Also, vector-computable schemes can be used for SIMD/GPU architectures that use a smaller lookup table (of order number of symbols) of b(M,x) to calculate both s and g.

If an escape code is reserved at position zero, as above, such modification can be made:

$$s(M, x) = \begin{cases} \langle esc \rangle & x = 0 \\ \min\left\{ j : x < 1 + \sum_{i=0}^{j} l(M, i) \right\} & \text{otherwise} \end{cases}$$

$$b(M, j) = 1 + \sum_{i=0}^{j-1} l(M, i)$$

Similarly, the escape code is reserved at any number of other positions, such as at the end of the cycle (e.g. at x=4095), or in the middle.

C) A Method for Folding/Merging Transforms into rANS

Furthermore, given a symbol transform H that maps symbols to transformed symbols, the transform can be folded into the encoder and decoder by replacing M with M', b with b', and l with l', as:

$$b'(M',S)=b(M',H(S))$$

$$l'(M',S)=l(M',H(S))$$

where M' is the model built using H(s) instead of S, such that:

$$Pr(H(S_k)|M'(H(S_{k-1}), \ldots, H(S_{k-c}))) \cong Pr(H(S_k)|H(S_{k-1}), H(S_{k-2}), \ldots, H(S_{k-c}))$$

In practice, this means that the lookup tables in encoding and decoding are replaced with a transformed set, thus making the cost of the transform negligible.

According to a particular use-case, which uses a pair of transforms $H_q$ and $H_d$ such that for all valid symbols S:

$$R(H_q(S), H_d(S))=S$$

where R is a recovery function (for example addition). The intention here is that the combined R, $H_q$ and $H_d$ allows for lossless recovery of the original symbols.

For example, $H_q$ can be chosen to quantise the symbols such as genomic quality scores using Illumina, NCBI, or other quantisation schemes. The delta can be encoded into $H_d$, using simple addition for R. More complicated schemes for R allow for quantisation and delta coding using continuous remapped ranges instead of having gaps in transformed symbol values between quantisation levels.

Each of the methods A, B, and C can be used separately or in combination with each other.

The present disclosure includes the following modifications to the general approach of rANS encoding:

1. Probability distribution tables are constructed using a Markov model of n'th order using a subset of data (by counting occurrences of strings of symbols). Thus the probability distribution of the next symbol is dependent on the history of the 'n' preceding symbols. The very first 'n' symbols required to start off the Markov model are encoded/compressed with a separate fixed probability distribution. These Markov models, described by probability distribution tables are constructed using a subset of the data and are used to encode a larger portion of the data.
2. The process of constructing a model from a subset of data to encode a larger portion of data will be referred to as sampling. This type of sampling is conducted across stages to build multiple models (iterative refinement). For example, if processing 1,000,000 symbols at a time in a streaming fashion, the initial model is built on the first 1,000,000 symbols, and the next model is built using the first 16,000,000 symbols. This is done by keeping counts of strings from the earlier model and accumulating counts in a streaming manner until enough samples are included for building the subsequent model, and so on. Compression for the first 16,000,000 symbols is done using a first model, and thereafter is done with a successor model. This is extensible to any number of successor models until a sufficiently accurate model is built.
3. Since the Markov model is built on a subset of the actual data, the Markov model can have zero probability transitions that may be encountered on subsequent data. A special escape code with a small non-zero probability can be reserved to encode any unexpected transitions or symbols. Upon encountering this escape code, the real symbol is encoded using a fixed static probability distribution. This approach allows any symbols to be added with only minimal skew to the sample probability distribution. Alternatively, by strictly reducing the number of allowable symbols to a small set (say to 16), those symbols with probability zero can be encoded with a small non-zero probability without as much of a penalty on compression efficiency.

4. In situations where the symbol stream is split into two streams, where the first stream represents a quantised version of the original stream and the second stream stores the remaining information that would be used to reconstruct the original stream (delta-encoding), due to the way that rANS works, using lookup tables (LUT) that convert symbols to probability (and cumulative probability), one can fold quantisation/delta-encoding into the LUT's for compression and decompression. For example, a LUT mapping symbol s to frequency f may be represented f=C[s]. A quantisation LUT may be of the form s'=Q[s]. So that to perform both functions, f=C[Q[s]] can be replaced with a merged LUT G s.t. G[s]=C[Q[s]]. Similarly for folding a quantisation-delta (delta as a result of quantisation) LUT. A more formal and general description is described in the text above.

5. For this approach of Markov based rANS, the probability distribution used for rANS is then switched per symbol based on the history 'h' as part of an even larger LUT W of probability distributions for each possible history. I.e. M=W[h] where h is the n'th order history prior to the symbol being decoded (when used with escape coding, when escapes occur the history for that special symbol is replaced with a known/predefined fixed symbol e.g. zero or most frequent symbol, so that it fits within the bounds of the Markov model historical context).

6. For storage efficiency, probability distribution tables are compressed using some off-the-shelf compression method (e.g. gzip). These tables have a significant amount of redundancy that is therefore exploited during compression.

7. For improving the efficiency of decompression, rANS ordinarily uses a fully expanded LUT (e.g. with 4096 entries corresponding to the full probability integer scale). At 5 bytes per entry, this amounts to 20 KB for a single probability distribution. While this approach is fast and practical for ordinary TANS, it can quickly become impractical when combined with Markov models. To illustrate this with an example, a 2nd order 256 symbol Markov model would result in 256×256 LUTs of 4096 entries (each 5 bytes), resulting in 1.2 GB of entries leading to low performance due to excessive cache misses. Similarly, a 4th order 16-symbol Markov model would result in 1.2 GB. However, SIMD vector techniques can be used to perform the equivalent lookup rapidly across symbols values, with memory scaling according to the number of symbols. This approach results in 256×256 LUTs of 256 entries (each 4 bytes), resulting in 64 MB for the first case, and 16×16×16 LUTs of 16 entries (each 4 bytes) resulting in 4 MB for the second case. For example, the 16 entry case can be done by using an unsigned vector subtraction of the desired slot minus the cumulative probabilities from the probability distribution table given the context (see FIG. 1 below). With a 8×16 bit SIMD pipeline, this operation is done twice, once for the first set of 8 probabilities and then for the next set of 8 probabilities, then take the minimum of the two subtracted results, and use, for example, the phminposuw SSE4.1 (Intel SSE4.1 Programming Reference, Intel Corporation, 2007) instruction that finds and returns the index and value of the minimum within the vector, which in this case exactly returns both the symbol position and required probability bias that the full 4096-entry table would encode. The probability distribution table can be scaled and the lower bit(s) encoded to determine which of the two sets of 8 probabilities the symbol belongs to, thus recovering the full symbol. For the 256 symbol case, another approach is used, which divides the symbols into an oct-tree for 8×16 bit SIMD operations (see FIG. 2 below), or a hex-tree if there are 16×16 bit SIMD operations, using the resultant index from phminposuw (or similar) to traverse the tree and recover the symbol, frequency and bias.

The following additional adjustments can also be made to the compression method in order to utilise information that is specific to quality score information that is originally produced by high-throughput genome sequencing devices:

1. For Illumina 8-bin quantisation (Reducing Whole-Genome Data Storage Footprint http://www.illumina.com/documents/products/whitepapers/white-paper_dataco mpression.pdf), restricting to 16 symbols is particularly interesting for fast and efficient compression. The Illumina 8-bin model can be extended so that it restricts the deltas to 16 symbols (from −5 to +10). The extended Illumina 8-bin model then encompasses 16 values of 0-152, resulting in a combined binned and delta range of 0-162.

2. For delivering higher compression ratios of quality score information, this compression algorithm can be combined with the scheme as described by Canovas, Moffat and Turpin in Lossy compression of quality scores in genomic data, Bioinformatics, 2014 Aug. 1; 30(15):2130-6. doi: 10.1093/bioinformatics/btu183. The quantised form of quality score data can be produced using p-block MinMax (or other modes) of quantisation. To preserve the entire set of quality score information, one can also encode the difference (delta) of the quantised version and the original in separate streams. This delta can then be encoded using the same (or some other) method.

3. This approach of Markov based rANS can also be applied to the quality score sparsification described by Y. W. Yu, D. Yorukoglu, and B. Berger in Traversing the k-mer Landscape of NGS Read Datasets for Quality Score Sparsification, Research in Computational Molecular Biology, Lecture Notes in Computer Science Volume 8394, 2014, pp 385-399, Springer.

Existing file-formats that store genomic sequence information (e.g. FASTQ) and sequence alignment information (e.g. BAM/CRAM) use off-the-shelf compression algorithms such as zlib (a variant of LZ77 (J. Ziv, A. Lempel, A Universal Algorithm for Sequential Data Compression, 1977)). These algorithms are robust and have a proven track record for general datasets. The compression algorithms described in the present disclosure can provide better compression ratios for genomic sequence datasets without compromising on compression/decompression throughput.

DETAILED DESCRIPTION OF FIGURES

Referring now to FIG. 1, shown is a schematic illustration of efficient lookups that can be executed using SIMD operations. The upper part (FIG. 1a) of the figure illustrates how 8-entry lookups are done using 128 bit SIMD words with the help of the combination of vector subtraction (e.g. using psubw instruction in SSE4.1) and vector operation of returning the symbol position and bias value (functions s and g described earlier operating on (X mod m)) of the minimum scalar element (e.g. using phminposuw instruction in SSE4.1). The underflowed subtractions do not cause any concern as they are effectively large unsigned values and preferentially not selected by the minpos operation. The lower part (FIG. 1b) illustrates how the 8-entry method described above can be used for implementing 16-entry lookups. The 16 entries are represented as a pair of SIMD 128 bit words, namely top and bottom. The least significant bits of scalars in top are all the same (e.g. 0). This also applies for the least significant bits of bottom, but of opposite value (e.g. 1). Each of these entries goes through vector subtraction akin to 8-entry lookups. As we are looking for the minimum scalar, a vector min operation of these two vector outputs can be used before identifying the position of the minimum value. Since the least significant bit of scalars is consistent in both vectors, namely top and bottom, it can be used to identify whether the min value is from top or from bottom. Again this is used to determine both the symbol position and the bias value.

Referring now to FIG. 2, shown is a schematic illustration of tree-based vector lookups that can be executed using SIMD operations for a full table that is 64 entries in size. It is essentially composed of two iterations of the FIG. 1a operation, in a tree structure. The full table is ordered according to cumulative probability of symbols, and is split into eight contiguous 8-entry tables. Here a top-level 8-entry table is also used which contains the minimum value for each of the lower eight 8-entry tables. This top-level table is used similarly to the case in FIG. 1a. The index position found using the top level table can be used to retrieve the corresponding lower-level table, where the FIG. 1a operation is repeated again to retrieve a position and value. The index position from the top-level table corresponds to the most-significant-bits of the full table index, and the position from the low-level table corresponds to the least-significant bits of the full table index. This full table index is the symbol position, and the minimum scalar value from the lower-level operation is the bias value. In general, this tree-based vector lookup approach can be trivially extended for any radix and depth of tree, encompassing arbitrarily sized full tables (e.g. 256 entries).

The invention claimed is:

1. A method for encoding a data stream comprising:
   constructing a probability distribution table according to rANS technique using a Markov model of symbols in the data stream; and
   with the probability distribution table, converting the symbols to probabilities such that the converted symbols are configured for last-in first-out decoding; and
   wherein the probability distribution table is extended with an escape code to form an extended probability distribution table, wherein the escape code is used to mark a temporary switch to a secondary probability distribution table for encoding transitions or symbols in the data stream that cannot be encoded using said probability distribution table.

2. The method according to claim 1, further comprising utilizing a plurality of probability distribution tables, wherein each of the plurality of distribution tables is constructed from a subset of the data stream.

3. The method according to claim 2, wherein each of the plurality of distribution tables is used to encode another subset of the data stream.

4. The method according to claim 1, wherein the said probability distribution table is saved in non-volatile storage in a compressed format.

5. The method according to claim 1, wherein said data stream represents information containing gene sequences.

6. A system for encoding a data stream using a rANS technique, comprising:
   computing hardware configured to: construct a probability distribution table according to rANS technique using a Markov model of symbols in the data stream and with the probability distribution table; convert the symbols to probabilities such that the converted symbols are configured for last-in first-out decoding; and
   extend the probability distribution table with an escape code, wherein the escape code is used to mark a temporary switch to a secondary probability distribution table for encoding transitions or symbols in the data stream that cannot be encoded using said probability distribution table; and
   a non-volatile storage operatively coupled with the computing hardware.

7. The system as set forth in claim 6, wherein the computing hardware is further configured to utilize a plurality of probability distribution tables, wherein each of the plurality of distribution tables is constructed from a subset of the data stream.

8. The system as set forth in claim 7, wherein the computing hardware is further configured to utilize each of the plurality of distribution tables to encode another subset of the data stream.

9. The system as set forth in claim 6, wherein the computing hardware is further configured to save the probability distribution table in the non-volatile storage in a compressed format.

10. The system as set forth in claim 6, wherein the data stream represents information containing gene sequences.

11. A non-transitory computer-readable medium for encoding a data stream, comprising instructions stored thereon, that when executed on a processor, cause the processor to:
    construct a probability distribution table according to rANS technique using a Markov model of symbols in the data stream;
    with the probability distribution table, convert the symbols to probabilities such that the converted symbols are configured for last-in first-out decoding; and
    extend the probability distribution table with an escape code, wherein the escape code is used to mark a temporary switch to a secondary probability distribution table for encoding transitions or symbols in the data stream that cannot be encoded using said probability distribution table.

12. The non-transitory computer-readable medium of claim 11, wherein the instructions further cause the processor to utilize a plurality of probability distribution tables, wherein each of the plurality of distribution tables is constructed from a subset of the data stream.

13. The non-transitory computer-readable medium of claim 12, wherein the instructions further cause the processor to utilize each of the plurality of distribution tables to encode another subset of the data stream.

14. The non-transitory computer-readable medium of claim 11, wherein the instructions further cause the processor to save the probability distribution table in non-volatile storage in a compressed format.

15. The non-transitory computer-readable medium of claim 11, wherein the data stream represents information containing gene sequences.

* * * * *